United States Patent
Sheng et al.

(10) Patent No.: US 11,651,120 B2
(45) Date of Patent: May 16, 2023

(54) METHOD AND SYSTEM OF REPORTING STRETCHING FAILURE IN STAMPING DIE DEVELOPMENT

(71) Applicant: GM Global Technology Operations LLC, Detroit, MI (US)

(72) Inventors: Ziqiang Sheng, Troy, MI (US); J N Goan, Troy, MI (US); Adam R Groseclose, Sterling Heights, MI (US); Kleber M Cabral, Auburn Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 222 days.

(21) Appl. No.: 17/038,590

(22) Filed: Sep. 30, 2020

(65) Prior Publication Data

US 2022/0100923 A1 Mar. 31, 2022

(51) Int. Cl.
  *G06F 30/20* (2020.01)
  *B21D 22/22* (2006.01)
  *G06F 30/15* (2020.01)

(52) U.S. Cl.
  CPC ............ *G06F 30/20* (2020.01); *B21D 22/22* (2013.01); *G06F 30/15* (2020.01)

(58) Field of Classification Search
  CPC .......... G06F 30/20; G06F 30/15; B21D 22/22
  See application file for complete search history.

(56) References Cited

U.S. PATENT DOCUMENTS

| 7,130,708 B2 | 10/2006 | Wang et al. | |
| 2004/0127614 A1* | 7/2004 | Jiang | C09J 7/20 524/270 |
| 2020/0326780 A1* | 10/2020 | Kearney | G06F 3/011 |

OTHER PUBLICATIONS

Furrer, D. U., and S. L. Semiatin. "Sheet metal forming simulation." ASM Handbook B 22 (2010): 290-305. (Year: 2010).*
Okude, Yusuke, Yasuyoshi Saito, and Taku Iwaoka. "Forming limit diagram with anisotropy considering of Ti—6Al—4V sheets and prediction of ductile fracture by experiment and FEA." Procedia Manufacturing 15 (2018): 931-939. (Year: 2018).*

* cited by examiner

*Primary Examiner* — Bradley A Teets
*Assistant Examiner* — Pursottam Giri
(74) *Attorney, Agent, or Firm* — Vivacqua Crane, PLLC

(57) ABSTRACT

A system is provided for producing a die that forms a sheet metal blank into a workpiece for a stamped vehicle component. The system includes a processor receiving design data associated with the workpiece. The processor produces a computer simulation based on the data and determines a stretching index of the workpiece. The processor compares the stretching index to an index threshold. The processor generates a stretching failure signal when the stretching index is above the index threshold. The processor generates a stretching acceptance signal, and a display device indicates that the workpiece has a fracture when the stretching index is below the index threshold. The display device indicates that the workpiece does not have the fracture, when the display device receives the stretching acceptance signal, such that a die manufacturing device transforms a tool material into the die.

20 Claims, 3 Drawing Sheets

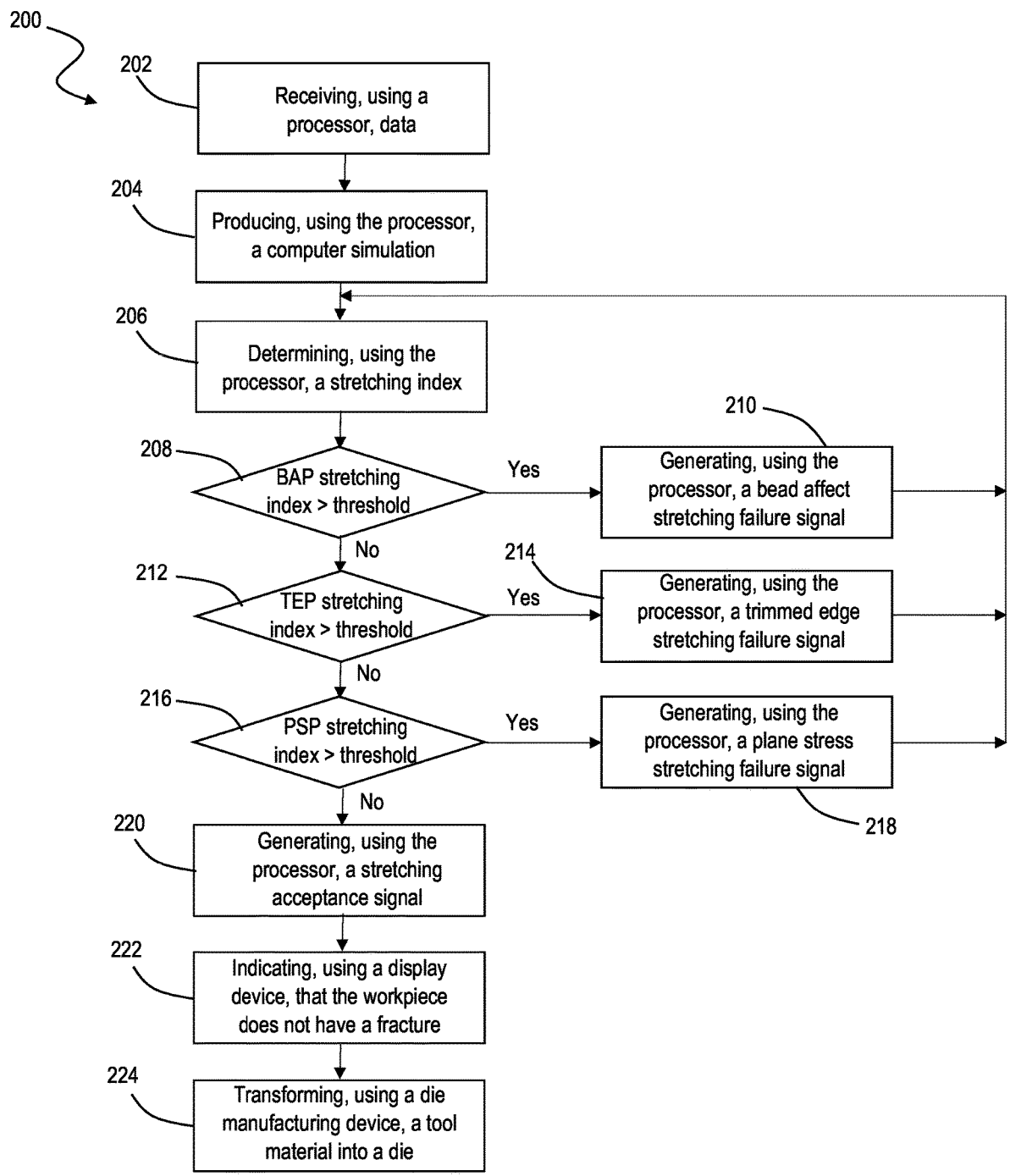

METHOD AND SYSTEM OF REPORTING STRETCHING FAILURE IN STAMPING DIE DEVELOPMENT

INTRODUCTION

The present disclosure generally relates to stamping die development, and more particularly relates to consolidating three different stretching failure detection under three different working conditions into one stretching failure detection for transforming a tool material into a die for a stamping machine.

Automotive manufacturers continuously investigate improvements of manufacturing processes for automotive vehicle components. As one example, stamping is a manufacturing process for producing sheet metal components. During the stamping process, a die and a binder ring coordinate with one another to hold a piece of sheet metal or so-called blank in a fixed position. The die includes a die cavity, and a punch draws the sheet metal into the die cavity to form a workpiece having a desired shape associated with the die cavity. The binder ring includes beads for engaging the sheet metal and controlling an amount of sheet metal flowing into the die cavity. More specifically, the beads prevent excessive an amount of sheet metal from flowing into the die cavity, which in turn prevents wrinkling in the workpiece. The beads also prevent an insufficient amount sheet metal from flowing into the die cavity, which in turn prevents stretching failure in the workpiece.

Stretching failure can be in the form of localized necking and associated fracture in multiple portions of the workpiece, which are unacceptable for cosmetic and performance requirements. For example, the localized necking and associated fracture can form at a blank edge or a trimmed edge, which is sheared from a coil of sheet metal or formed in the workpiece. The localized necking and associated fracture can form in a bead affect area of the workpiece where the material goes through bead. The localized necking and associated fracture can form in a plane stress area of the workpiece where the normal contact pressure is below a predetermined yield strength during forming, such as below 5% yield strength. In industrial practices, technicians manually execute multiple methods with associated criteria independent from one another for identifying stretching failure in the different portions of the workpiece. This process can introduce complexity and uncertainties into stretching failure detection, which can in turn lower the efficiency of developing stamping die.

Thus, while existing methods and systems of developing stamping die achieve their intended purpose, there is a need for a new and improved method and system for developing stamping die that address these issues.

SUMMARY

According to several aspects of the present disclosure, a system is provided for producing a die configured to form a sheet metal blank into a workpiece for a stamped part, which has a final shape for a motor vehicle. The workpiece has a bead affect portion, a trimmed edge portion, and a plane stress portion. The system includes a processor configured to receive data for at least one of a die design, a part design, and a stamping process plan associated with the workpiece. The processor is further configured to produce a computer simulation based on the data. The processor is further configured to determine a stretching index for an associated one of the bead affect portion, the trimmed edge portion, and the plane stress portion of the workpiece, in response to the processor producing the computer simulation. The processor is further configured to compare the stretching index for each of the bead affect portion, the trimmed edge portion, and the plane stress portion to an index threshold. The processor is further configured to generate a stretching failure signal, in response to the processor determining that the stretching index for at least one of the bead affect portion, the trimmed edge portion, and the plane stress portion is above the index threshold. The processor is further configured to receive altered data for at least one of an altered die design, an altered part design, and an altered stamping process plan associated with the workpiece and produce an altered computer simulation based on the altered data. The processor is further configured to determine an altered stretching index for an associated one of the bead affect portion, the trimmed edge portion, and the plane stress portion of the workpiece, in response to the processor producing the altered computer simulation. The processor is further configured to determine an altered stretching index for at least one of the bead affect portion, the trimmed edge portion, and the plane stress portion, in response to the processor producing the altered computer simulation. The processor is further configured to generate a stretching acceptance signal, in response to the processor determining that one of the stretching index and the altered stretching index for each of the bead affect portion, the trimmed edge portion, and the plane stress portion is below the index threshold. The system further includes a display device electrically coupled to the processor. The display device is configured to indicate that the workpiece has a fracture and prompt a user to input altered data into the processor, in response to the display device receiving the stretching failure signal. The display device is further configured to indicate that the workpiece does not have the fracture, in response to the display device receiving the stretching acceptance signal, such that the processor sends the stretching acceptance signal to a die manufacturing device for transforming a tool material into the die associated with one of the stretching index or the altered stretching index that is below the index threshold.

In one aspect, the processor is configured to receive data associated with the part design, with the data including a geometry of the stamped part and one or more material properties of the sheet metal forming the stamped part.

In another aspect, the processor is configured to generate a bead affect stretching failure signal, in response to the processor determining that the stretching index of the bead affect portion is above the index threshold. The display device indicates that the fracture is disposed in the bead affect portion, in response to the display device receiving the bead affect stretching failure signal from the processor.

In another aspect, the processor is configured to generate a trimmed edge stretching failure signal, in response to the processor determining that the stretching index of the trimmed edge portion is above the index threshold. The display device indicates that the fracture is disposed in the trimmed edge portion, in response to the display device receiving the trimmed edge stretching failure signal from the processor.

In another aspect, the processor is configured to generate a plane stress stretching failure signal, in response to the processor determining that the stretching index of the plane stress portion is above the index threshold. The display device indicates that the fracture in the plane stress portion, in response to the display device receiving the plane stress stretching failure signal from the processor.

In another aspect, the processor is configured to determine the stretching index of the bead affect portion by calculating SI=max($\varepsilon_1^i(\varepsilon_2^i)(1-\varphi)/\varepsilon_1^{FLC}(\varepsilon_2^i)$), where: SI is the stretching index; $\varepsilon_1^i$ is a major strain of the workpiece at integration points 0, 1, and 2 corresponding to an associated one of middle, upper, and lower planar layers forming a plate thickness of the workpiece; $\varepsilon_2^i$ is a minor strain of the workpiece at the integration points 0, 1, and 2; $\varepsilon_1^{FLC}(\varepsilon_2^i)$ is a major limit strain at the integration points at the associated minor strain $\varepsilon_2^i$ on the FLC; FLC is a forming limit curve associated with the sheet metal blank; and $\varphi$ is a correction factor for the bead affect portion.

In another aspect, the processor is configured to determine the bead affect portion, in response to the processor determining that $$\frac{\sigma_3^i}{\sigma_1^i} \le C,$$

where: $\sigma_3^i$ is a transverse normal stress at the middle planar layer; $\sigma_1^i$ is a major principle stress at the middle planar layer; and C is a bead affect portion threshold value.

In another aspect, the processor is configured to determine the stretching index of the plane stress portion by calculating SI=max($\varepsilon_1^i(\varepsilon_2^i)/\varepsilon_1^{FLC}(\varepsilon_2^i)$).

In another aspect, the processor is configured to determine the plane stress portion, in response to the processor determining that $$C < \frac{\sigma_3^i}{\sigma_1^i}.$$

The processor is configured to determine the stretching index of the trimmed edge portion by calculating SI=max ($\varepsilon_1^i/\varepsilon_1^{UT}$), where $\varepsilon_1^{UT}$ is a major limit strain for the trimmed edge portion.

In another aspect, the processor is configured to determine the trimmed edge portion, in response to the processor determining one of: $\tau > 0$, where $\tau$ is a shear stress; and a free edge of the workpiece that is created by a trimming operation.

According to several aspects of the present disclosure, a system is provided for producing a die configured to form a sheet metal blank into a workpiece for a stamped part that has a final shape for a motor vehicle, with the workpiece having a bead affect portion, a trimmed edge portion, and a plane stress portion. The system includes a processor configured to: receive data for at least one of a die design, a part design, and a stamping process plan associated with the workpiece. The processor is further configured to produce a computer simulation based on the data. The processor is further configured to determine a stretching index for an associated one of the bead affect portion, the trimmed edge portion, and the plane stress portion of the workpiece, in response to the processor producing the computer simulation. The processor is further configured to compare the stretching index for each of the bead affect portion, the trimmed edge portion, and the plane stress portion to an index threshold. The processor is further configured to generate a stretching failure signal, in response to the processor determining that the stretching index for at least one of the bead affect portion, the trimmed edge portion, and the plane stress portion is above the index threshold. The processor is further configured to receive altered data for at least one of an altered die design, an altered part design, and an altered stamping process plan associated with the workpiece. The processor is further configured to produce an altered computer simulation based on the altered data. The processor is further configured to determine an altered stretching index for an associated one of the bead affect portion, the trimmed edge portion, and the plane stress portion of the workpiece, in response to the processor producing the altered computer simulation. The processor is further configured to determine an altered stretching index for at least one of the bead affect portion, the trimmed edge portion, and the plane stress portion, in response to the processor producing the altered computer simulation. The processor is further configured to generate a stretching acceptance signal, in response to the processor determining that one of the stretching index and the altered stretching index for each of the bead affect portion, the trimmed edge portion, and the plane stress portion is below the index threshold. The system further includes a display device electrically coupled to the processor. The display device is configured to indicate that the workpiece has a fracture and prompt a user to input the altered data, in response to the display device receiving the stretching failure signal. The display device is further configured to indicate that the workpiece does not have the fracture, in response to the display device receiving the stretching acceptance signal. The system further includes a die manufacturing device electrically coupled to the processor. The die manufacturing device is configured to transform a tool material into the die, in response to the die manufacturing device receiving the stretching acceptance signal from the processor.

In one aspect, the die manufacturing device is a computer numerically controlled machine configured to conduct a material removal operation in response to the computer numerically controlled machine receiving the stretching acceptance signal from the processor.

In another aspect, the processor is configured to generate a bead affect stretching failure signal in response to the processor determining that the stretching index of the bead affect portion is above the index threshold, and the display device indicates that the fracture is disposed in the bead affect portion in response to the display device receiving the bead affect stretching failure signal from the processor.

In another aspect, the processor is configured to generate a trimmed edge stretching failure signal, in response to the processor determining that the stretching index of the trimmed edge portion is above the index threshold. The display device indicates that the fracture is disposed in the trimmed edge portion, in response to the display device receiving the trimmed edge stretching failure signal from the processor.

In another aspect, the processor is configured to generate a plane stress stretching failure signal, in response to the processor determining that the stretching index of the plane stress portion is above the index threshold. The display device indicates that the fracture in the plane stress portion, in response to the display device receiving the plane stress stretching failure signal from the processor.

According to several aspects of the present disclosure, a method is provided for operating a system for producing a die that is configured to form a sheet metal blank into a workpiece for a stamped part that has a final shape for a motor vehicle. The system includes a processor, a display device, and a die manufacturing device. The workpiece includes a bead affect portion, a trimmed edge portion, and a plane stress portion. The processor receives data for at least one of a die design, a part design, and a stamping process plan associated with the workpiece. The processor produces a computer simulation based on the data and determines a stretching index for an associated one of the bead affect portion, the trimmed edge portion, and the plane stress portion of the workpiece, in response to the processor producing the computer simulation. The processor compares the stretching index for each of the bead affect portion, the trimmed edge portion, and the plane stress portion to an index threshold. The processor generates a stretching failure signal, in response to the processor determining that the stretching index for at least one of the bead affect portion, the trimmed edge portion, and the plane stress portion is above the index threshold. The processor receives altered data and produces an altered computer simulation based on the altered data. The processor determines an altered stretching index for an associated one of the bead affect portion, the trimmed edge portion, and the plane stress portion of the workpiece, in response to the processor producing the altered computer simulation. The processor determines an altered stretching index for at least one of the bead affect portion, the trimmed edge portion, and the plane stress portion, in response to the processor producing the altered computer simulation. The processor generates a stretching acceptance signal, in response to the processor determining that one of the stretching index and the altered stretching index for each of the bead affect portion, the trimmed edge portion, and the plane stress portion is below the index threshold. The display device indicates that the workpiece has a fracture and prompts a user to input the altered data, in response to the display device receiving the stretching failure signal. The display device indicates that the workpiece does not have the fracture, in response to the display device receiving the stretching acceptance signal. The die manufacturing device transforms a tool material into the die associated with one of the stretching index and the altered stretching index that is below the index threshold, in response to the die manufacturing device receiving the stretching acceptance signal.

In one aspect, a computer numerically controlled machine transforms the tool material into the die, and the processor receives the data associated with at least one of the die design, the part design, and the stamping process plan. The part design includes at least one of a geometry of the stamped part and one or more material properties of the sheet metal of the stamped part.

In another aspect, the processor determines the stretching index of the bead affect portion by calculating SI=max($\varepsilon_1^i$ ($\varepsilon_2^i$)(1−φ)/$\varepsilon_1^{FLC}$($\varepsilon_2^i$)), in response to the processor determining that $$\frac{\sigma_3^i}{\sigma_1^i} \leq C,$$

where: SI is the stretching index; $\varepsilon_1^i$ is a major strain of the workpiece at integration points 0, 1, and 2 corresponding to an associated one of middle, upper, and lower planar layers forming a plate thickness of the workpiece; $\varepsilon_2^i$ is a minor strain of the workpiece at the integration points 0, 1, and 2; $\varepsilon_1^{FLC}$($\varepsilon_2^i$) is a major limit strain at the integration points at the associated minor strain $\varepsilon_2^i$ on the FLC; FLC is a forming limit curve associated with the sheet metal blank; φ is a correction factor for the bead affect portion; a is a transverse normal stress; $\sigma_1^i$. is a major principle stress; and C is a bead affect portion threshold value.

In another aspect, the processor determines the stretching index of the trimmed edge portion by calculating SI=max ($\varepsilon_1^i$/$\varepsilon_1^{UT}$) in response to the processor determining that τ>0, where: $\varepsilon_1^{UT}$ is a major limit strain for the trimmed edge portion; and r is a shear stress.

In another aspect, the processor determines the stretching index of the plane stress portion by calculating SI=max($\varepsilon_1^i$ ($\varepsilon_2^i$)/$\varepsilon_1^{FLC}$($\varepsilon_2^i$)), in response to the processor determining that $$C < \frac{\sigma_3^i}{\sigma_1^i}.$$

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

FIG. 3 is a flowchart of one example of a method for operating the system of FIG. 1.

DETAILED DESCRIPTION

Figure 1:
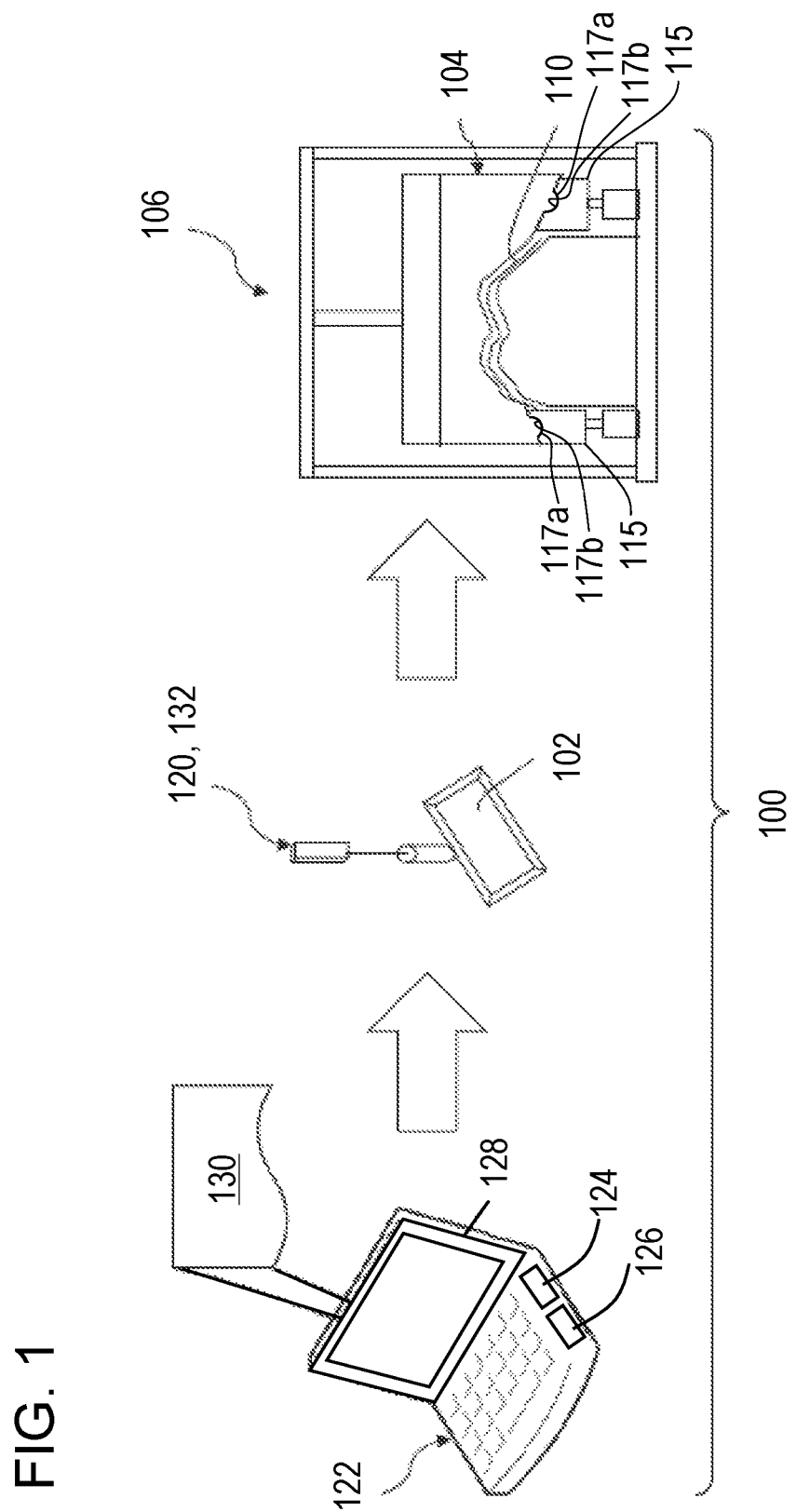
FIG. 1 is a schematic diagram of one example of a system for producing a die of a stamping machine that forms a sheet metal blank into a stamped part of a motor vehicle.

The following description is merely exemplary in nature and is not intended to limit the present disclosure, application, or uses.

An exemplary system and method of reporting stretching failure in stamping die development consolidates three criteria and processes for detecting three different types of stretching failures into one stretching index (SI) representation. Examples of the stretching failures include a trimmed edge fracture, a localized necking and following fracture at bead affect zone, and a localized necking and following fracture at plane stress condition. The system and method display the stretching failure risk in a unified SI representation with, for example, one-click operation by a technician. A technician can use the detected stretching failure risk for the practical application of altering the design of the die, part, stamping process plan, or any combination thereof and producing an associated die that transforms sheet metal blanks into stamp parts having the reduced stretching failure risk. Non-limiting examples of altering the design can include adjusting bead shapes or blank shapes and changing form feature on stamped part and thus allowing corresponding shape change on stamping die. It is contemplated that the method and system can include any number of other alterations to the design and the associated manufactured die and stamped part.

A processor generates computer simulations for the practical application of identifying and correcting issues with a design of a die, a part, and a stamping process plan prior to finalizing the design and using a die machining apparatus to build the die associated with the finalized design. To that end, techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions.

The current description relates to examples of methods and systems that employ steps and activities carried out by modules, including computers employing discrete rules and calculations, integrated into practical applications, such as the manufacture of physical articles. In this example, the method and system uses one or more modules to transform tool materials into dies that produce stamped parts meeting sophisticated criteria. The practical applications of the current disclosure include elements that implement or use computer and/or mental activities in conjunction with particular and integral machines and manufactured articles. The specific machines employed, and the beneficial results achieved, are tangible and physical. The disclosed activities have practical utility and solve technological challenges. More specifically, in this example, the method and system use sheet metal forming simulation for applying an index threshold for multiple criteria and associated portions of stamped parts so as to provide a robust analysis of die design, reduce human error, and simplify stamping operations. Also, for example, the method and system can accurately produce higher quality dies and associated stamped parts, such that fewer hardware modifications are required.

The module may be implemented wholly, or partially, as a hardware circuit comprising discrete components. A module may also be implemented in programmable hardware devices, programmable logic devices, or the like. Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together but may include disparate instructions stored in different locations that, when joined logically together, comprise the module and achieve the stated purpose for the module. Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set or may be distributed over different locations including over different storage devices, and may exist, at least partially, merely as electronic signals on a system or network.

Figure 2:
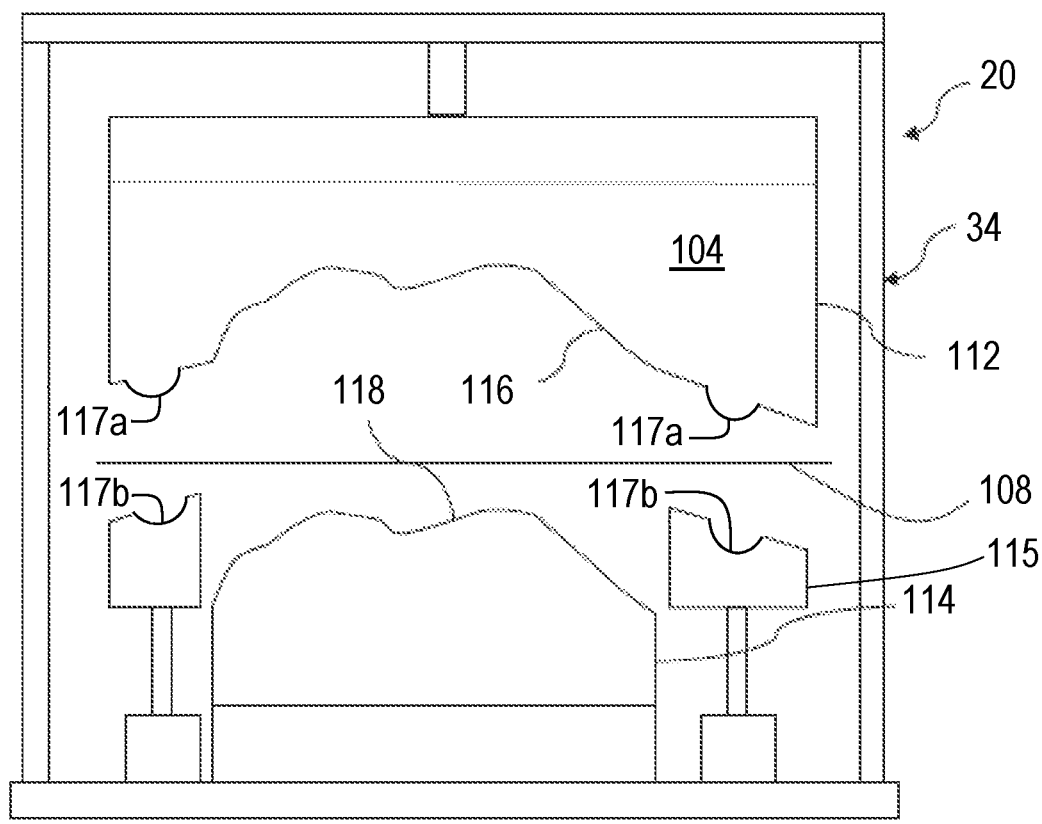
FIG. 2 is an enlarged view of the stamping machine illustrated in FIG. 1.

Referring now to FIGS. 1 and 2, a system 100 is provided for transforming a tool material 102 into a die 104 for a stamping machine 106, which is in turn configured to form a sheet metal blank 108 (FIG. 2) into a stamped part 110 of a motor vehicle. As best shown in FIG. 2, the die 104 includes an upper die half 112, a binder 115, and a lower die half 114 each fixed in the stamping machine 106. The die halves 112, 114 have respective complementary die surfaces 116, 118 facing one another. The upper die half 112 has a male bead 117*a*, and the binder 105 has a trough or recess 117*b* that is associated with the male bead 117*a*. The upper die half 112 is configured to move downward and clamp the sheet metal blank 108 with the binder 115. The upper die half 112 is configured to move further downward with the binder 115, which is supported by cushion pins to draw the sheet metal blank 108 flowing through the bead and into the die cavity between the die surfaces 116, 118. The die surfaces 116, 118 are configured to form the sheet metal blank 108 and change its shape into a workpiece that reflects the profile of the die surfaces 116, 118. In another example (not shown), the die can include the lower die half having a die cavity and a punch for drawing the sheet metal blank into the die cavity. The die 104 may be one in a series of dies through which the sheet metal blank is progressively processed to change the sheet metal blank into the shape of the finished product. Prior to building the die, simulation tools and 3-D math data of the finished stamped part to be produced is used to evaluate the design of the die, the stamped part, and the stamping process plan. This provides the ability to make any necessary correction in a computer simulation as compared to physical die, thus saving substantial time and expense.

In this example, the system 100 includes one or more computing devices 40 for generating simulations to identify and correct issues prior to finalizing die design and actuating the die manufacturing device 120 to build the die. The computing device 122 includes at least one processor 124, a processor-readable medium 126, and some form of input and output hardware. Program or code segments can be stored in the processor-readable medium 126 or transmitted by a computer data signal embodied in a carrier wave over a transmission medium or communication path. The "processor-readable medium", "computer-readable medium", or "machine-readable medium" may include any transitory or non-transitory medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or any combination thereof. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

The computing device 122 may be a standalone computer system, a portable computing device, or a personal computing device (e.g., a tablet computer, a laptop computer, a personal digital assistant (PDA), a smartphone), or the like. For purposes of the present disclosure, the computing device 122 is capable of storing, maintaining, and executing a program, code segments, or other instructions configured to evaluate aspects of stamping operations including dies using mesh data files. However, it is further contemplated that the processor can store other software tools that produce simulations without using mesh data models. In addition, the computing device 122 includes a display device 128 electrically coupled to the processor 124 for displaying visualizations 130, such as those of application pages, part surfaces, and die surfaces. Visualizations of part surfaces can include an indication or illustration of a part fracture.

The processor 124 is configured to receive data for at least one of a die design, a part design, and a stamping process plan associated with the workpiece. The data associated with the part design can include a geometry of the stamped part and one or more material properties of the sheet metal forming the stamped part. It is contemplated that the data can include other suitable parameters of the finished stamped part to be produced.

The processor 124 is further configured to produce a computer simulation of the die 104 based on the data. The processor 124 can produce a computer simulation using software applications, such as computer aided design (CAD), stored on the processor-readable medium 126, in response to the processor 124 receiving the part data. The simulation of the die produces an associated simulated stamped part having a bead affect portion, a trimmed edge portion, and a plane stress portion.

The processor 124 is further configured to determine a stretching index for the bead affect portion of the workpiece, in response to the processor producing the computer simulation. In this example, the processor is configured to determine the stretching index and of the bead affect portion by calculating $SI=\max(\varepsilon_1^i(\varepsilon_2^i)(1-\varphi)/\varepsilon_1^{FLC}(\varepsilon_2^i))$, in response to the processor determining that $$\frac{\sigma_3^i}{\sigma_1^i} \leq C,$$

where: SI is the stretching index; $\varepsilon_1^i$ is a major strain of the workpiece at an integration points 0, 1, and 2 corresponding to an associated one of middle, upper, and lower planar layers forming a plate thickness of the workpiece; $\varepsilon_2^i$ is a minor strain of the workpiece at the integration points 0, 1, and 2; $\varepsilon_1^{FLC}(\varepsilon_2^i)$ is a major limit strain at the integration points at the associated minor strain $\varepsilon_2^i$ on the FLC; FLC is a forming limit curve associated with the sheet metal blank; $\varphi$ is a correction factor for the bead affect portion; $\sigma_3^i$ is a transverse normal stress at the middle planar layer; $\sigma_1^i$ is a major principle stress at the middle planar layer; and C is a bead affect portion threshold value. The bead affect portion threshold value can be empirically determined through testing, or it can be observed by a technician evaluating the metal flow. It is contemplated that the system and method can include other suitable steps for detecting the threshold value.

The processor 124 is further configured to determine a stretching index for the trimmed edge portion of the workpiece, in response to the processor producing the computer simulation. In this example, the processor is configured to determine the stretching index of the trimmed edge portion by calculating $SI=\max(\varepsilon_1^i/\varepsilon_1^{UT})$, in response to the processor determining that $\tau>0$, where: $\varepsilon_1^{UT}$ is a major limit strain for the trimmed edge portion; $\tau$ is a shear stress; and the processor determines a free edge of the workpiece that is created by a trimming operation.

The processor 124 is further configured to determine a stretching index for the plane stress portion of the workpiece, in response to the processor producing the computer simulation. In this example, the processor is configured to determine the stretching index of the plane stress portion by calculating $SI=\max(\varepsilon_1^i(\varepsilon_2^i)/\varepsilon_1^{FLC}(\varepsilon_2^i))$, in response to the processor determining that $$C < \frac{\sigma_3^i}{\sigma_1^i}.$$

The processor 124 is further configured to compare the stretching index and for each of the bead affect portion, the trimmed edge portion, and the plane stress portion to an index threshold. Continuing with the previous example, the index threshold can be 1, and the processor can be configured to determine whether the stretching index for an associated one of the bead affect portion, the trimmed edge portion, and the plane stress portion is below 1. However, it is contemplated the index threshold can be any suitable value, and the processor can determine whether the stretching index for the bead affect portion, the trimmed edge portion, the plane stress portion, or any combination thereof satisfy other relationships relative to the index threshold.

The processor 124 is further configured to generate a stretching failure signal, in response to the processor 124 determining that the stretching index of at least one of the bead affect portion, the trimmed edge portion, and the plane stress portion is below the index threshold. The display device 128 is configured to indicate that the workpiece has a fracture and prompt a user to input altered data into the processor, in response to the display device receiving the stretching failure signal. More specifically, continuing with the previous example, the processor is configured to generate a bead affect stretching failure signal, in response to the processor 124 determining that the stretching index of the bead affect portion is above 1. The display device 128 can indicate that the fracture is disposed in the bead affect portion and prompt a user to input altered data into the processor, in response to the display device 128 receiving the bead affect stretching failure signal from the processor 124. The processor 124 is configured to generate a trimmed edge stretching failure signal, in response to the processor 124 determining that the stretching index of the trimmed edge portion is above 1. The display device 128 can indicate that the fracture is disposed in the trimmed edge portion and prompt a user to input altered data into the processor 124, in response to the display device 128 receiving the trimmed edge stretching failure signal from the processor 124. The processor 124 is configured to generate a plane stress stretching failure signal, in response to the processor 124 determining that the stretching index of the plane stress portion is above 1. The display device 128 can display a fracture in the plane stress portion and prompt the user to input the altered data into the processor 124, in response to the display device 128 receiving the plane stress stretching failure signal from the processor 124.

The processor 124 is further configured to receive the altered data for at least one of the altered die design, the altered part design, and the altered stamping process plan associated with the workpiece. The processor is further configured to produce the altered computer simulation based on the altered data. Similar to determining the initial stretching index described above, the processor 124 is further configured to determine an altered stretching index for an associated one of the bead affect portion, the trimmed edge portion, and the plane stress portion of the workpiece in response to the processor producing the altered computer simulation. The processor 124 is further configured to compare the altered stretching index for each of the bead affect portion, the trimmed edge portion, and the plane stress portion to the index threshold. Continuing with the previous example, the processor can be configured to determine whether the altered stretching index for an associated one of the bead affect portion, the trimmed edge portion, and the plane stress portion is below 1. However, it is contemplated the index threshold can be any suitable value, and the processor can determine whether the stretching index for the bead affect portion, the trimmed edge portion, the plane stress portion, or any combination thereof satisfy other relationships relative to the index threshold.

The processor 124 is further configured to generate the stretching failure signal, in response to the processor 124 determining that the altered stretching index of at least one of the bead affect portion, the trimmed edge portion, and the plane stress portion is below the index threshold. The display device 128 is configured to indicate that the workpiece has a fracture and prompt a user to input altered data into the processor, in response to the display device 128 receiving the stretching failure signal. More specifically, continuing with the previous example, the processor is configured to generate a bead affect stretching failure signal, in response to the processor 124 determining that the altered stretching index of the bead affect portion is above 1. The display device 128 can indicate that the fracture is disposed in the bead affect portion and prompt a user to input altered data into the processor, in response to the display device 128 receiving the bead affect stretching failure signal from the processor 124. The processor 124 is configured to generate the trimmed edge stretching failure signal, in response to the processor 124 determining that the altered stretching index of the trimmed edge portion is above 1. The display device 128 can indicate that the fracture is disposed in the trimmed edge portion and prompt a user to input altered data into the processor 124, in response to the display device 128 receiving the trimmed edge stretching failure signal from the processor 124. The processor 124 is configured to generate a plane stress stretching failure signal, in response to the processor 124 determining that the altered stretching index of the plane stress portion is above 1. The display device 128 can display a fracture in the plane stress portion and prompt the user to input the altered data into the processor 124, in response to the display device 128 receiving the plane stress stretching failure signal from the processor 124.

The processor 124 is configured to generate a stretching acceptance signal, in response to the processor 124 determining that the stretching index or the altered stretching index of each of the bead affect portion, the trimmed edge portion, and the plane stress portion is below the index threshold.

The system further includes a die manufacturing device 120 electrically coupled to the processor 124. The die manufacturing device 120 is configured to transform a tool material into the die 104 associated with the stretching index or the altered stretching index of each of the bead affect portion, the trimmed edge portion, and the plane stress portion being below the index threshold, in response to the die manufacturing device 120 receiving the stretching acceptance signal from the processor 124. In this example, the die manufacturing device 120 is a computer numerically controlled machine 132 configured to conduct a material removal operation in response to the computer numerically controlled machine receiving the stretching acceptance signal from the processor. However, it is contemplated that the die manufacturing device can be other metal removal machines for building the die 104, which may in turn be used in the stamping machine 106 for producing the stamped part 110.

Referring to FIG. 3, one example of a method 200 of operating the system 100 of FIG. 1 is shown. The method 200 commences at block 202 with the processor 124 receiving data associated with the die design, the part design, the stamping process plan, or any combination thereof. In one example, the processor 124 can data associated with the part design that includes at least one of a geometry of the stamped part and one or more material properties of the sheet metal of the stamped part.

At block 204, the processor 124 produces a computer simulation of the die 104, in response to the processor 124 receiving the data. In another example, the processor 124 produces an altered computer simulation of the die 104, in response to the processor 124 receiving altered data.

At block 206, the processor 124 determines a stretching index for an associated one of the bead affect portion, the trimmed edge portion, and the plane stress portion of the workpiece 110, in response to the processor producing the computer simulation. In another example, the processor 124 determines an altered stretching index for an associated one of the bead affect portion, the trimmed edge portion, and the plane stress portion of the workpiece 110, in response to the processor producing the altered computer simulation.

At block 208, the processor 124 compares the stretching index for the bead affect portion to the index threshold. In this example, the index threshold is 1, and the processor 124 determines the stretching index of the bead affect portion by calculating SI=max($\varepsilon_1^i(\varepsilon_2^i)(1-\varphi)/\varepsilon_1^{FLC}(\varepsilon_2^i)$), in response to the processor determining that $$\frac{\sigma_3^i}{\sigma_1^i} \leq C.$$

If the processor 124 determines that the stretching index for the bead portion is above 1, the method 200 proceeds to block 210. If the processor 124 determines that the stretching index for the bead affect portion is below 1, the method 200 proceeds to block 212. In another example, this step is accomplished by the processor 124 comparing the altered stretching index for the bead affect portion to the index threshold.

At block 210, the processor 124 generates a bead affect stretching failure signal, in response to the processor 124 determining that the stretching index or the altered stretching index for the bead affect portion is above the index threshold. The display device indicates that the workpiece has a fracture associated with the bead affect portion and prompts the user to input altered data associated with the bead affect portion into the processor 124. The method 200 returns to block 206.

At block 212, the processor 124 compares the stretching index for the trimmed edge portion to the index threshold. Continuing the previous example, the index threshold is 1 and the processor 124 determines the stretching index of the trimmed edge portion by calculating SI=max ($\varepsilon_1^i/\varepsilon_1^{UT}$), in response to the processor determining the trimmed edge portion. The processor 124 determines the trimmed edge portion, in response to the processor 124 determining that either $\tau > 0$, where $\tau$ is a shear stress, a free edge of the workpiece is created by a trimming operation. If the processor 124 determines that the stretching index for the trimmed edge portion is above 1, the method 200 proceeds to block 214. If the processor 124 determines that the stretching index for the trimmed edge portion is below 1, the method 200 proceeds to block 216. In another example, the processor 124 compares an altered stretching index for the trimmed edge portion to the index threshold. In another example, this step is accomplished by the processor 124 comparing the altered stretching index for the trimmed edge portion to the index threshold.

At block 214, the processor 124 generates a trimmed edge stretching failure signal, in response to the processor 124 determining that the stretching index or the altered stretching index for the trimmed edge portion is above the index threshold. The display device indicates that the workpiece has a fracture associated with the trimmed edge portion and prompts the user to input altered data associated with the trimmed edge portion into the processor 124, in response to the display device receiving the trimmed edge stretching failure signal from the processor 124. The method 200 returns to block 206.

At block 216, the processor 124 compares the stretching index for the plane stress portion to the index threshold. Continuing with the previous example, the index threshold is 1, and the processor 124 determines the stretching index of the plane stress portion by calculating $SI=\max(\varepsilon_1^i(\varepsilon_2^i)/\varepsilon_1^{FLC}(\varepsilon_2^i))$, in response to the processor 124 determining that $$C < \frac{\sigma_3^i}{\sigma_1^i}.$$

If the processor 124 determines that the stretching index for the plane stress portion is above 1, the method 200 proceeds to block 218. If the processor 124 determines that the stretching index for the plane stress portion is below 1, the method 200 proceeds to block 220. In another example, this step is accomplished by the processor 124 comparing the altered stretching index for the plane stress portion to the index threshold.

At block 218, the processor 124 generates a plane stress stretching failure signal, in response to the processor 124 determining that the stretching index or the altered stretching index for the plane stress portion is above the index threshold. The display device indicates that the workpiece has a fracture associated with the plane stress portion and prompts the user to input altered data associated with the plane stress portion into the processor 124, in response to the display device 128 receiving the plane stress stretching failure signal from the processor 124. The method 200 returns to block 206.

At block 220, the processor 124 determines that the stretching index of each of the bead affect portion, the trimmed edge portion, and the plane stress portion satisfies the index threshold, and the processor 124 generates a stretching acceptance signal.

At block 222, the processor 124 generates a stretching acceptance signal, and the display device 128 is configured to indicate that the workpiece does not have the fracture, in response to the display device 128 receiving the stretching acceptance signal from the processor 124.

At block 224, the processor 124 sends the stretching acceptance signal to the die manufacturing device for transforming a tool material into the die. The die is associated with one of the stretching index and the altered stretching index that is below the index threshold, such that the die can be used to transform sheet metal blanks into stamped parts without a stretching failure.

The description of the present disclosure is merely exemplary in nature and variations that do not depart from the general sense of the present disclosure are intended to be within the scope of the present disclosure. Such variations are not to be regarded as a departure from the spirit and scope of the present disclosure.

What is claimed is:

1. A system for producing a die configured to form a sheet metal blank into a workpiece for a stamped part that has a final shape for a motor vehicle, with the workpiece having a bead affect portion, a trimmed edge portion, and a plane stress portion, the system comprising:
    a processor configured to:
        receive data for at least one of a die design, a part design, and a stamping process plan associated with the workpiece;
        produce a computer simulation based on the data;
        determine a stretching index for an associated one of the bead affect portion, the trimmed edge portion, and the plane stress portion of the workpiece in response to the processor producing the computer simulation;
        compare the stretching index for each of the bead affect portion, the trimmed edge portion, and the plane stress portion to an index threshold;
        generate a stretching failure signal in response to the processor determining that the stretching index for at least one of the bead affect portion, the trimmed edge portion, and the plane stress portion is above the index threshold;
        receive altered data for at least one of an altered die design, an altered part design, and an altered stamping process plan associated with the workpiece;
        produce an altered computer simulation based on the altered data;
        determine an altered stretching index for an associated one of the bead affect portion, the trimmed edge portion, and the plane stress portion of the workpiece in response to the processor producing the altered computer simulation;
        generate a stretching acceptance signal in response to the processor determining that one of the stretching index and the altered stretching index for each of the bead affect portion, the trimmed edge portion, and the plane stress portion is below the index threshold; and
        alter at least one of a design of the die, the stamped part, and a stamping process plan;
    a display device electrically coupled to the processor;
        wherein the display device is configured to indicate that the workpiece has a fracture and prompt a user to input the altered data into the processor, in response to the display device receiving the stretching failure signal;
        wherein the display device is configured to indicate that the workpiece does not have the fracture in response to the display device receiving the stretching acceptance signal, such that the processor sends the stretching acceptance signal to a die manufacturing device, with the die manufacturing device transforming a tool material into the die associated with one of the stretching index and the altered stretching index that is below the index threshold; and
        wherein the die manufacturing device produces the die associated with the at least one of the altered die design, the altered part design, and the altered stamping process plan to transform the sheet metal blank into the stamp part having a reduced stretching failure risk.

2. The system of claim 1 wherein the processor is configured to receive the data associated with the part design, with the data comprising at least one of a geometry of the stamped part and at least one material property of the sheet metal forming the stamped part.

3. The system of claim 2 wherein the processor is configured to generate a bead affect stretching failure signal in response to the processor determining that the stretching index of the bead affect portion is above the index threshold, and the display device indicates that the fracture is disposed in the bead affect portion in response to the display device receiving the bead affect stretching failure signal from the processor.

4. The system of claim 3 wherein the processor is configured to generate a trimmed edge stretching failure signal in response to the processor determining that the stretching index of the trimmed edge portion is above the index threshold, and the display device indicates that the fracture is disposed in the trimmed edge portion in response to the display device receiving the trimmed edge stretching failure signal from the processor.

5. The system of claim 4 wherein the processor is configured to generate a plane stress stretching failure signal in response to the processor determining that the stretching index of the plane stress portion is above the index threshold, and the display device indicates that the fracture in the plane stress portion in response to the display device receiving the plane stress stretching failure signal from the processor.

6. The system of claim 5 wherein the processor is configured to determine the stretching index of the bead affect portion by calculating $SI=\max(\varepsilon_1^i(\varepsilon_2^i)(1-\varphi)/\varepsilon_1^{FLC}(\varepsilon_2^i))$, where:

SI is the stretching index;

$\varepsilon_1^i$ is a major strain of the workpiece at integration points 0, 1, and 2 corresponding to an associated one of middle, upper, and lower planar layers forming a plate thickness of the workpiece;

$\varepsilon_2^i$ is a minor strain of the workpiece at the integration points 0, 1, and 2;

$\varepsilon_1^{FLC}(\varepsilon_2^i)$ is a major limit strain at the integration points at the associated minor strain $\varepsilon_2^i$ on the FLC;

FLC is a forming limit curve associated with the sheet metal blank; and $\varphi$ is a correction factor for the bead affect portion.

7. The system of claim 6 wherein the processor is configured to determine the bead affect portion in response to the processor determining that $$\frac{\sigma_3^i}{\sigma_1^i} \leq C,$$

where:

$\sigma_3^i$ is a transverse normal stress at the middle planar layer;

$\sigma_1^i$ is a major principle stress at the middle planar layer; and

C is a bead affect portion threshold value.

8. The system of claim 7 wherein the processor is configured to determine the stretching index of the plane stress portion by calculating $SI=\max(\varepsilon_1^i(\varepsilon_2^i)/\varepsilon_1^{FLC}(\varepsilon_2^i))$.

9. The system of claim 8 wherein the processor is configured to:

determine the plane stress portion in response to the processor determining that $$C < \frac{\sigma_3^i}{\sigma_1^i};$$

and determine the stretching index of the trimmed edge portion by calculating $SI=\max(\varepsilon_1^i/\varepsilon_1^{UT})$, where $\varepsilon_1^{UT}$ is a major limit strain for the trimmed edge portion.

10. The system of claim 9 wherein the processor is configured to determine the trimmed edge portion in response to the processor determining one of:

$\tau>0$, where $\tau$ is a shear stress; and a free edge of the workpiece that is created by a trimming operation.

11. A system for producing a die configured to form a sheet metal blank into a workpiece for a stamped part that has a final shape for a motor vehicle, with the workpiece having a bead affect portion, a trimmed edge portion, and a plane stress portion, the system comprising:

a processor configured to:

receive data for at least one of a die design, a part design, and a stamping process plan associated with the workpiece;

produce a computer simulation based on the data;

determine a stretching index for an associated one of the bead affect portion, the trimmed edge portion, and the plane stress portion of the workpiece in response to the processor producing the computer simulation;

compare the stretching index for each of the bead affect portion, the trimmed edge portion, and the plane stress portion to an index threshold;

generate a stretching failure signal in response to the processor determining that the stretching index for at least one of the bead affect portion, the trimmed edge portion, and the plane stress portion is above the index threshold;

receive altered data for at least one of an altered die design, an altered part design, and an altered stamping process plan associated with the workpiece;

produce an altered computer simulation based on the altered data;

determine an altered stretching index for an associated one of the bead affect portion, the trimmed edge portion, and the plane stress portion of the workpiece in response to the processor producing the altered computer simulation;

determine an altered stretching index for at least one of the bead affect portion, the trimmed edge portion, and the plane stress portion in response to the processor producing the altered computer simulation;

generate a stretching acceptance signal in response to the processor determining that one of the stretching index and the altered stretching index for each of the bead affect portion, the trimmed edge portion, and the plane stress portion is below the index threshold; and alter at least one of the die design, the part design, and the stamping process plan; and a display device electrically coupled to the processor, with the display device being configured to indicate that the workpiece has a fracture in response to the display device receiving the stretching failure signal, and the display device being configured to indicate that the workpiece does not have the fracture in response to the display device receiving the stretching acceptance signal; and a die manufacturing device electrically coupled to the processor, with the die manufacturing device transforming a tool material into the die in response to the die manufacturing device receiving the stretching acceptance signal from the processor, with the die manufacturing device producing the associated die that transforms the sheet metal blank into the stamped part having a reduced stretching failure risk.

12. The system of claim 11 wherein the die manufacturing device comprises a computer numerically controlled machine configured to conduct a material removal operation in response to the computer numerically controlled machine receiving the stretching acceptance signal from the processor.

13. The system of claim 12 wherein the processor is configured to generate a bead affect stretching failure signal in response to the processor determining that the stretching index of the bead affect portion is above the index threshold, and the display device indicates that the fracture is disposed in the bead affect portion in response to the display device receiving the bead affect stretching failure signal from the processor.

14. The system of claim 13 wherein the processor is configured to generate a trimmed edge stretching failure signal in response to the processor determining that the stretching index of the trimmed edge portion is above the index threshold, and the display device indicates that the fracture is disposed in the trimmed edge portion in response to the display device receiving the trimmed edge stretching failure signal from the processor.

15. The system of claim 14 wherein the processor is configured to generate a plane stress stretching failure signal in response to the processor determining that the stretching index of the plane stress portion is above the index threshold, and the display device indicates that the fracture in the plane stress portion in response to the display device receiving the plane stress stretching failure signal from the processor.

16. A method of operating a system having a processor, a display device, and a die manufacturing device for producing a die that is configured to form a sheet metal blank into a workpiece for a stamped part that has a final shape for a motor vehicle, with the workpiece having a bead affect portion, a trimmed edge portion, and a plane stress portion, the method comprising:

receiving, using the processor, data for at least one of a die design, a part design, and a stamping process plan associated with the workpiece;

producing, using the processor, a computer simulation based on the data;

determining, using the processor, a stretching index for an associated one of the bead affect portion, the trimmed edge portion, and the plane stress portion of the workpiece in response to the processor producing the computer simulation;

comparing, using the processor, the stretching index for each of the bead affect portion, the trimmed edge portion, and the plane stress portion to an index threshold;

generating, using the processor, a stretching failure signal in response to the processor determining that the stretching index for at least one of the bead affect portion, the trimmed edge portion, and the plane stress portion is above the index threshold;

receiving, using the processor, altered data for at least one of an altered die design, an altered part design, and an altered stamping process plan associated with the workpiece;

producing, using the processor, an altered computer simulation based on the altered data;

determining, using the processor, an altered stretching index for an associated one of the bead affect portion, the trimmed edge portion, and the plane stress portion of the workpiece in response to the processor producing the altered computer simulation;

generating, using the processor, a stretching acceptance signal in response to the processor determining that one of the stretching index and the altered stretching index for each of the bead affect portion, the trimmed edge portion, and the plane stress portion is below the index threshold;

altering, using the processor, at least one of the die design, the part design, and the stamping process plan;

indicating, using the display device, that the workpiece has a fracture and prompting a user to input the altered data in response to the display device receiving the stretching failure signal;

indicating, using the display device, that the workpiece does not have the fracture in response to the display device receiving the stretching acceptance signal;

transforming, using the die manufacturing device, a tool material into the die associated with one of the stretching index and the altered stretching index that is below the index threshold, in response to the die manufacturing device receiving the stretching acceptance signal from the processor; and producing, using the die manufacturing device, the associated die that transforms the sheet metal blank into the stamp part having the reduced stretching failure risk.

17. The method of claim 16 further comprising:

transforming, using a computer numerically controlled machine, the tool material into the die; and the processor receiving the data associated with at least one of the die design, the part design, and the stamping process plan, with the part design comprising at least one of a geometry of the stamped part and at least one material property of the sheet metal of the stamped part.

18. The method of claim 17 further comprising the processor determining the stretching index of the bead affect portion by calculating $SI=\max(\varepsilon_1^{i}(\varepsilon_2^{i})(1-\varphi)/\varepsilon_1^{FLC}(\varepsilon_2^{i}))$ in response to the processor determining that $$\frac{\sigma_3^i}{\sigma_1^i} \leq C,$$

where:

SI is the stretching index;

$\varepsilon_1^{i}$ is a major strain of the workpiece at integration points 0, 1, and 2 corresponding to an associated one of middle, upper, and lower planar layers forming a plate thickness of the workpiece;

$\varepsilon_2^{i}$ is a minor strain of the workpiece at the integration points 0, 1, and 2;

$\varepsilon_1^{FLC}(\varepsilon_2^{i})$ is a major limit strain at the integration points at the associated minor strain $\varepsilon_2^{i}$ on the FLC;

FLC is a forming limit curve associated with the sheet metal blank;

$\varphi$ is a correction factor for the bead affect portion;

$\sigma_3^{i}$ is a transverse normal stress;

$\sigma_1^{i}$ is a major principle stress; and

C is a bead affect portion threshold value.

19. The method of claim 18 further comprising the processor determining the stretching index of the trimmed edge portion by calculating $SI=\max(\varepsilon_1^{i}/\varepsilon_1^{UT})$ in response to the processor determining that $\tau>0$, where:

$\varepsilon_1^{UT}$ is a major limit strain for the trimmed edge portion; and $\tau$ is a shear stress.

20. The method of claim 19 further comprising the processor determining the stretching index of the plane stress portion by calculating SI=max($\varepsilon_1^i(\varepsilon_2^i)/\varepsilon_1^{FLC}(\varepsilon_2^i)$) in response to the processor determining that $$C < \frac{\sigma_3^i}{\sigma_1^i}.$$

* * * * *